(12) United States Patent
Evans et al.

(10) Patent No.: US 7,585,141 B2
(45) Date of Patent: Sep. 8, 2009

(54) LOAD LOCK SYSTEM FOR ION BEAM PROCESSING

(75) Inventors: Morgan Evans, Manchester, MA (US); Douglas E. May, Melrose, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 264 days.

(21) Appl. No.: 11/048,093

(22) Filed: Feb. 1, 2005

(65) Prior Publication Data

US 2006/0169206 A1    Aug. 3, 2006

(51) Int. Cl.
    *H01L 21/677* (2006.01)
(52) U.S. Cl. .............. 414/217; 414/935; 414/939; 118/719; 156/345.34; 156/345.32; 250/526
(58) Field of Classification Search ............ 156/345.31, 156/345.32; 118/719; 414/939
    See application file for complete search history.

(56) References Cited

U.S. PATENT DOCUMENTS

| | | | |
|---|---|---|---|
| 4,475,045 A | 10/1984 | Holden et al. | |
| 4,504,194 A | 3/1985 | Holden | |
| 4,836,733 A | 6/1989 | Hertel et al. | |
| 4,850,806 A * | 7/1989 | Morgan et al. | 417/53 |
| 5,002,464 A | 3/1991 | Lee | |
| 5,088,895 A | 2/1992 | Webb | |
| 5,125,781 A | 6/1992 | Breunig et al. | |
| 5,486,080 A | 1/1996 | Sieradzki | |
| 5,727,392 A * | 3/1998 | Matte | 62/55.5 |
| 6,079,927 A | 6/2000 | Muka | |
| 6,206,971 B1 * | 3/2001 | Umotoy et al. | 118/715 |
| 6,251,192 B1 | 6/2001 | Kawamura et al. | |
| 6,364,592 B1 | 4/2002 | Hofmeister | |
| 6,428,262 B1 | 8/2002 | Vanderpot et al. | |
| 6,530,732 B1 | 3/2003 | Theriault et al. | |
| 6,558,509 B2 | 5/2003 | Kraus et al. | |
| 6,609,877 B1 | 8/2003 | Ramsay | |
| 6,719,516 B2 | 4/2004 | Kroeker | |
| 6,722,835 B1 | 4/2004 | Stevens et al. | |
| 6,729,824 B2 | 5/2004 | Lei et al. | |
| 6,748,293 B1 | 6/2004 | Larsen | |
| 2004/0076505 A1 | 4/2004 | Kinnard et al. | |
| 2005/0226739 A1 * | 10/2005 | Huntley et al. | 417/313 |

FOREIGN PATENT DOCUMENTS

JP     07321047 A  * 12/1995
WO    WO 2004/107412 A2   12/2004

* cited by examiner

*Primary Examiner*—Karla Moore

(57) ABSTRACT

A load lock system includes a first load lock defining a first chamber, a second load lock defining a second chamber, and a vacuum pumping system to vacuum pump the first and second chambers. The vacuum pumping system includes a high vacuum pump, a first valve to connect the first chamber to an inlet of the high vacuum pump in a first pumping mode, and a second valve to connect the second chamber to the inlet of the high vacuum pump in a second pumping mode. The high vacuum pump may be a turbomolecular pump. The vacuum pumping system may include a valve manifold block located between the first and second load locks. The first and second valves may be mounted in the valve manifold block. The vacuum pumping system may further include a shared water pump.

6 Claims, 4 Drawing Sheets

LOAD LOCK SYSTEM FOR ION BEAM PROCESSING

FIELD OF THE INVENTION

This invention relates to ion beam processing of workpieces, such as semiconductor wafers, and, more particularly, to load lock systems for transferring wafers to and from a vacuum chamber.

BACKGROUND OF THE INVENTION

The processing of material, such as semiconductor wafers, for the manufacture of microelectronic circuits involves processing tools for performing a large number of processing steps. The processing steps are usually performed in a vacuum chamber. The processing tools typically handle and process wafers one at a time in order to optimize control and reproducibility. Such processing tools utilize automated wafer handling systems.

The throughput of the processing tools is an important factor in achieving low cost manufacture. The overall throughput is a function of both the processing time and the efficiency of automated wafer handling. Wafer handling involves introduction of the wafers in a wafer carrier into the processing tool, transfer of the wafers from the wafer carrier to a processing station, return of the wafers to the wafer carrier following processing and removal of the wafer carrier from the processing tool. Wafer processing is performed in a vacuum chamber. Wafer handling systems usually include one or more load locks for transferring wafers to and from the vacuum chamber with little impact on the pressure level in the vacuum chamber. The wafer carrier may be a FOUP (Front Opening Unified Pod), which is a standardized wafer carrier utilized for transporting wafers in fabrication facilities, or a cassette. Some of the processing and wafer handling operations may be performed concurrently to achieve efficient operation and high throughput. Accordingly, careful design of wafer handling systems is required. A variety of wafer handling techniques are known in the prior art.

In one prior system disclosed in U.S. Pat. No. 5,486,080, issued Jan. 23, 1996 to Sieradzki, a pair of robot arms transfers wafers from a first cassette in a first load lock to a transfer station and then to a processing station. After wafers from the first cassette have been processed, the robots reverse their respective roles and begin processing wafers from a second cassette located in a second load lock, while the first load lock is vented and the first cassette is replaced with a new cassette.

In another prior art system, a buffer is utilized to transfer wafers from several FOUPs to the load locks. The buffer includes a robot in a controlled environment chamber for transferring wafers to and between the FOUPs and the load locks.

All of the known prior art wafer handling systems have had one or more drawbacks, including but not limited to relatively low throughput, high cost and complex design. Accordingly, there is a need for improved methods and apparatus for transferring of workpieces, such as semiconductor wafers, to and from a vacuum chamber.

SUMMARY OF THE INVENTION

According to a first aspect of the invention, a load lock system comprises a first load lock defining a first chamber, a second load lock defining a second chamber and a vacuum pumping system configured to vacuum pump the first and second chambers. The vacuum pumping system comprises a high vacuum pump, a first valve to connect the first chamber to an inlet of the high vacuum pump in a first pumping mode, and a second valve to connect the second chamber to the inlet of the high vacuum pump in a second pumping mode. The high vacuum pump may include a turbomolecular pump, a water pump, or both.

The vacuum pumping system may further include a valve manifold block, and the first and second valves may be mounted in the valve manifold block. The valve manifold block may be located between the first and second load locks.

The vacuum pumping system may include a roughing pump, a first roughing valve to connect the first chamber to an inlet of the roughing pump in a roughing cycle of the first pumping mode and a second roughing valve to connect the second chamber to the inlet of the roughing pump in a roughing cycle of the second pumping mode. In some embodiments, the vacuum pumping system may include fast and slow roughing valves for each load lock. The roughing valves may be mounted in the valve manifold block.

According to a second aspect of the invention, a load lock system comprises a first load lock defining a first chamber, a second load lock defining a second chamber, and a vacuum pumping system configured to vacuum pump the first and second chambers. The vacuum pumping system comprises a valve manifold block positioned between the first and second load locks, a turbomolecular pump, a first valve, mounted in the valve manifold block, to connect the first chamber to an inlet of the turbomolecular pump in a first pumping mode, and a second valve, mounted in the valve manifold block, to connect the second chamber to the inlet of the turbomolecular pump in a second pumping mode.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
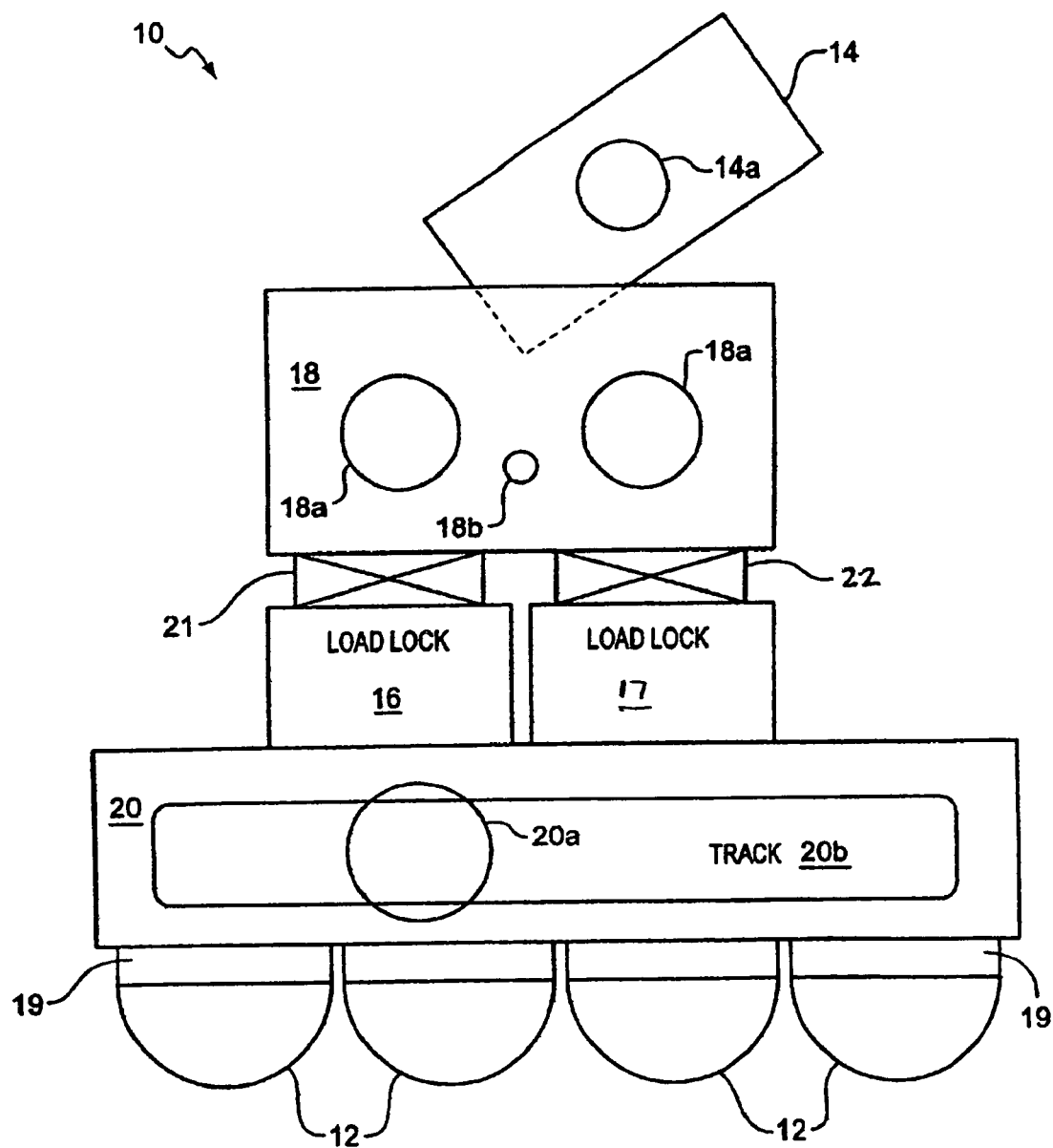
FIG. 1 is a schematic block diagram of a first prior art wafer handling system.

A schematic block diagram of a first prior art wafer handling system is shown in FIG. 1. A wafer handling system 10 interfaces with FOUPs 12. Wafers within the FOUPs 12 are transported from FOUPs 12 to a process chamber 14 through a buffer chamber 20, load locks 16 and 17 and a wafer handler chamber 18. Pod doors 19 interface between FOUPs 12 and buffer chamber 20 so that wafers can pass between FOUPs 12 and buffer chamber 20. In buffer chamber 20, an atmospheric robot 20a transports wafers along a track 20b to move wafers between FOUPs 12 and load locks 16 and 17. Buffer chamber 20 may be at or near atmospheric pressure, and provides a controlled, low particulate environment. Load locks 16 and 17 communicate with wafer handler chamber 18 through isolation valves 21 and 22, respectively. Wafer handler chamber 18 may include two vacuum robots 18a and a wafer alignment station 18b. A wafer is transferred by one of robots 18a from one of load locks 16, 17 to wafer alignment station 18b. The wafer then is transferred to a process station 14a in process chamber 14 for processing, such as by ion implantation. The process is reversed to transfer the wafer from process station 14a to one of the FOUPs, except that alignment station 18b is not utilized. The wafer is typically returned to the FOUP from which it was removed.

Figure 2:
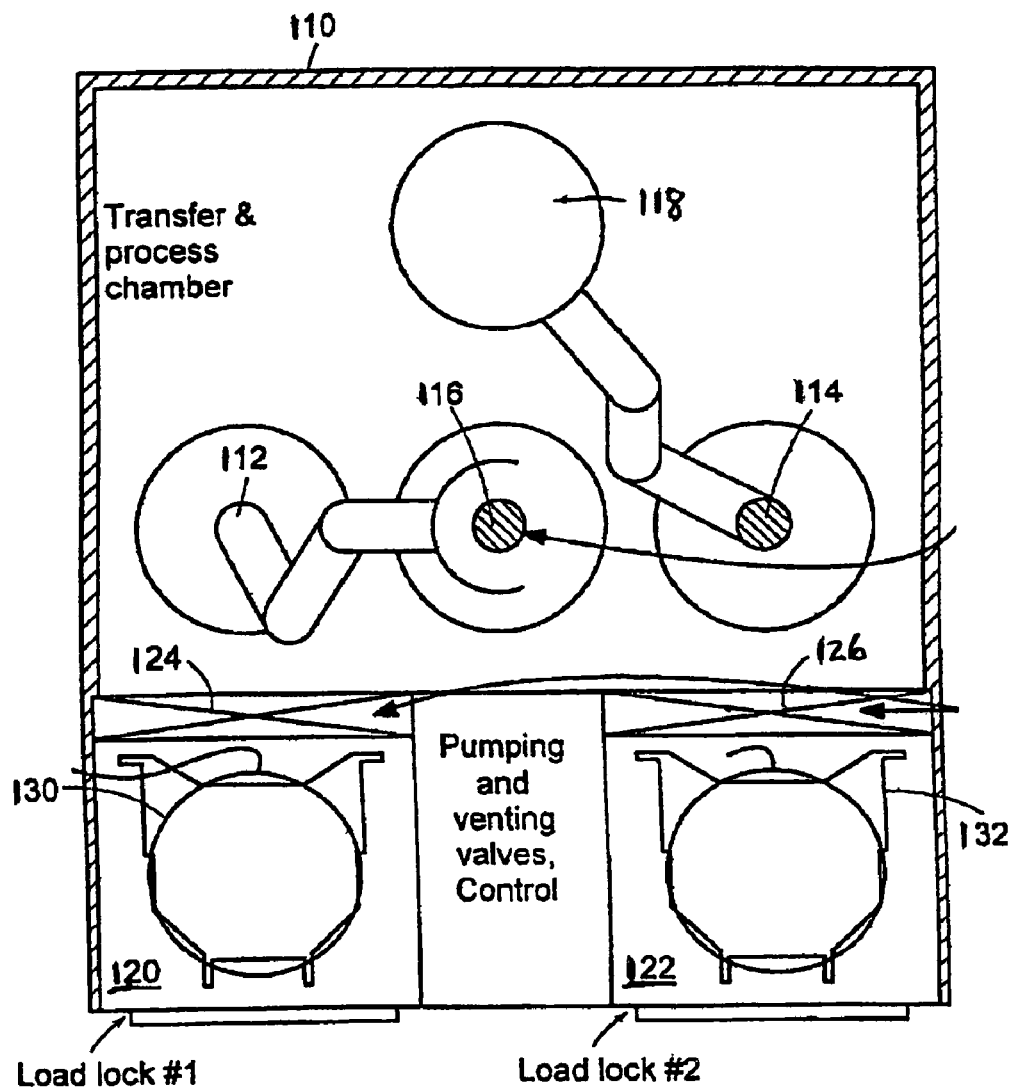
FIG. 2 is a schematic block diagram of a second prior art wafer handling system.

A schematic block diagram of a second prior art wafer handling system is shown in FIG. 2. A vacuum chamber 110 contains a first robot 112, second robot 114, transfer station 116 and a processing station 118. Load locks 120 and 122 communicate with vacuum chamber 110 through isolation valves 124 and 126, respectively. Cassettes 130 and 132, each holding a plurality of semiconductor wafers, are placed in the respective load locks 120 and 122.

In operation, a wafer is removed from cassette 130 by first robot 112 and is placed on transfer station 116. Transfer station 116 includes a wafer support and a position sensor, which determines the displacement error and rotational error of the wafer with respect to reference values. Position sensing typically requires rotating the wafer with respect to the sensor. The rotational error is corrected by an appropriate rotation of the wafer support at transfer station 116. The wafer is then transferred to processing station 118 by second robot 114 with an appropriate adjustment to eliminate displacement error. After processing, the wafer is returned to cassette 130 by first robot 112.

The throughput of the wafer handling systems shown in FIGS. 1 and 2 is a function of the robots in the wafer handler chamber, the load locks and, in the system of FIG. 1, the buffer. Since all wafers pass through the load locks before and after processing, increased throughput of the load locks improves the overall throughput of the wafer handling system.

The wafer handling systems shown in FIGS. 1 and 2 include a vacuum pumping system, not shown in FIGS. 1 and 2, which controls the pressure in each of the chambers during operation. In the case of the load locks, such as load locks 16 and 17 shown in FIG. 1 and described above, the vacuum pumping system is required to control the pressure in the load lock chamber during operation of the load lock. In particular, when a wafer is transferred from buffer chamber 20 to load lock 16, load lock 16 is vented to the pressure of buffer chamber 20, typically atmosphere, with isolation valve 21 closed and wafers are transferred into load lock 16 by robot 20a. Then a valve connecting load lock 16 and buffer chamber 20 is closed and the load lock chamber is vacuum pumped to the pressure of wafer handler chamber 18. Then, valve 21 is opened and the wafers in load lock 16 are accessed by robot 18a. The process is reversed for transfer of wafers from process station 14a to FOUPs 12 after processing. The performance of the wafer handling system depends, in part, on carefully controlled, high-speed vacuum pumping and venting of load locks 16 and 17 in the above sequence. Similar requirements are placed on the vacuum pumping system for load locks 20 and 22 shown in FIG. 2.

Figure 3:
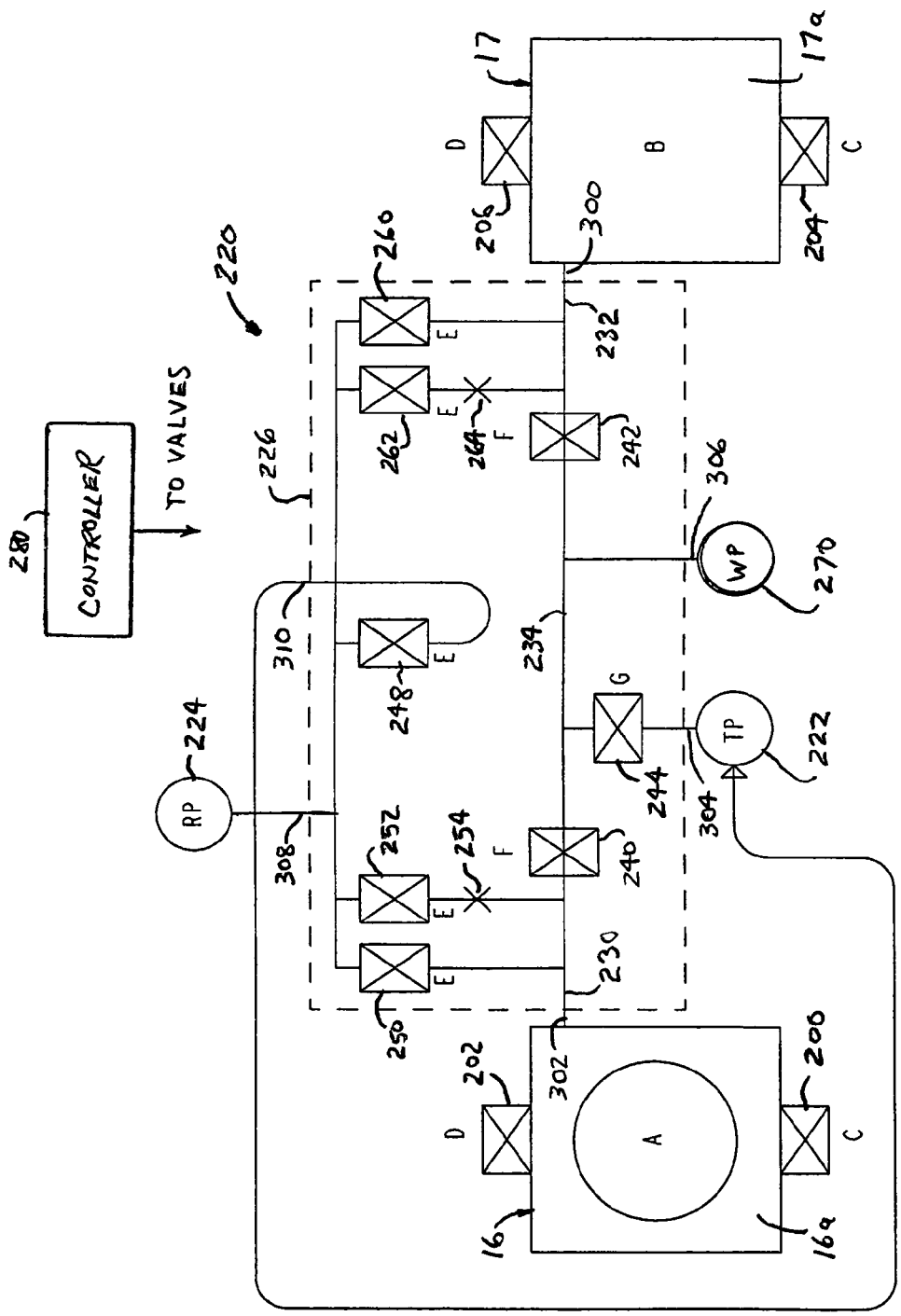
FIG. 3 is a schematic block diagram of a load lock system in accordance with an embodiment of the invention.

A schematic block diagram of a vacuum pumping system in accordance with an embodiment of the invention is shown in FIG. 3. In this embodiment, the vacuum pumping system of FIG. 3 operates with load locks 16 and 17, shown in FIG. 1 and described above. The vacuum pumping system can also operate with load locks 20 and 22, shown in FIG. 2 and described above. Thus, the vacuum pumping system can be utilized in wafer handling systems including buffers and in wafer handling systems not including buffers. Furthermore, the vacuum pumping system is not limited to operation with two load locks.

As shown, load lock 16 defines a load lock chamber 16a, and load lock 17 defines a load lock chamber 17a. Load lock chamber 16a communicates with buffer chamber 20 (FIG. 1) through an isolation valve 200 and communicates with wafer handler chamber 18 (FIG. 1) through an isolation valve 202. Similarly, load lock chamber 17a communicates with buffer chamber 20 through an isolation valve 204 and communicates with wafer handler chamber 18 through an isolation valve 206. Typically, valves 200 and 204 are sized to pass a batch of wafers, and valves 202 and 206 are sized to pass a single wafer.

A vacuum pumping system 220 is configured to control the pressure in load locks 16 and 17. Vacuum pumping system 220 may include a high vacuum pump such as a turbomolecular vacuum pump 222, a roughing vacuum pump 224, a valve manifold block 226, and a plurality of vacuum valves mounted in valve manifold block 226. Vacuum pumping system 220 is connected via a conduit 230 to chamber 16a in load lock 16 and is connected via a conduit 232 to chamber 17a in load lock 17. Conduit 230 connects to an internal manifold 234 in valve manifold block 226 through a vacuum valve 240, and conduit 232 connects to internal manifold 234 through a vacuum valve 242.

Internal manifold 234 connects through an optional vacuum valve 244 to an inlet of turbomolecular pump 222. Thus, by opening vacuum valves 240 and 244, with vacuum valve 242 closed, turbomolecular pump 222 is connected to chamber 16a of load lock 16. By opening vacuum valves 242 and 244, with vacuum valve 240 closed, turbomolecular pump 222 is connected to chamber 17a of load lock 17. The foreline of turbomolecular pump 222 is connected through a vacuum valve 248 to an inlet of roughing pump 224. Turbomolecular pump 222 is selected for rapid vacuum pumping of chambers 16a and 17a at different times during operation of the wafer handling system. One or more of vacuum valves 240, 242, 244 and 248 may be mounted in valve manifold block 226.

Vacuum pumping system 220 may further include valves and related elements for rough vacuum pumping of load locks 16 and 17. As shown in FIG. 3, a fast roughing valve 250 is coupled between conduit 230 and the inlet of roughing pump 224. A slow roughing valve 252 is coupled in series with a flow restrictor 254 between conduit 230 and the inlet of roughing pump 224. As described above, conduit 230 is coupled to chamber 16a of load lock 16. A fast roughing valve 260 is coupled between conduit 232 and the inlet of roughing pump 224. A slow roughing valve 262 is coupled in series with a flow restrictor 264 between conduit 232 and the inlet of roughing pump 224. As described above, conduit 232 is connected to chamber 17a of load lock 17.

One of the fast roughing valves 250 or 260 is opened during a fast roughing cycle, and one of the slow roughing valves 252 or 262 is opened during a slow roughing cycle. As described below, a slow roughing cycle may be followed by a fast roughing cycle. In other embodiments, a single roughing cycle is used for each of chambers 16a and 17a.

An optional water pump 270 may have an inlet connected to internal manifold 234. Water pump 270 may be connected via vacuum valve 240 to chamber 16a of load lock 16 or may be connected via vacuum valve 242 to chamber 17a of load lock 17. Water pump 270, which may be a cryogenic pump, removes water vapor from the load lock to which it is connected during a vacuum pumping cycle. The vacuum pumping system may include a turbomolecular pump, a water pump, or both, depending on system requirements.

Figure 4:
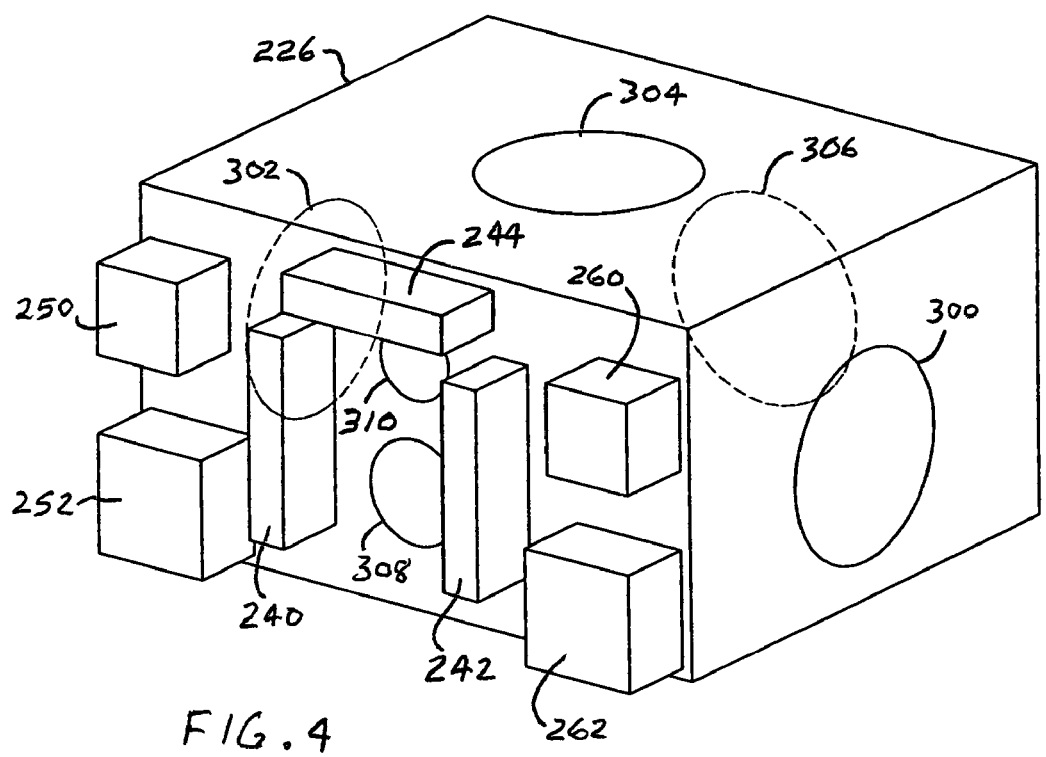
FIG. 4 is a simplified perspective view of a valve manifold block in accordance with an embodiment of the invention.

An implementation of valve manifold block 226 is shown in FIG. 4. Like elements in FIGS. 3 and 4 have the same reference numerals. As shown, valve manifold block 226 is configured as a metal block having ports for connection to load locks 16 and 17, turbomolecular pump 222, water pump 270, and roughing pump 224. In particular, a port 300 of valve manifold block 226 connects to load lock 17, a port 302 connects to load lock 16, a port 304 connects to the inlet of turbomolecular pump 222, a port 306 connects to water pump 270, a port 308 connects to the inlet of roughing pump 224, and a port 310 connects to the foreline of turbomolecular pump 222. In general, a water pump, a turbomolecular pump, or both may be connected to port 306 of valve manifold block 226. Similarly, a water pump, a turbomolecular pump, or both may be connected to port 304. Valves 240, 242, 244, 250, 252, 260 and 262 are mounted to one or more surfaces of valve manifold block 226. Valve manifold block 226 includes internal passages that interconnect the ports and the valves as shown schematically in FIG. 3 and described above. It will be understood that valve manifold block 226 is shown in FIG. 4 by way of example only and is not limiting as to the scope of the invention.

A controller 280 controls the operation of the vacuum valves shown in FIG. 3 and described above to perform vacuum pumping of load lock 16 and 17 during operation of the wafer handling system. It will be understood that controller 280 provides time-shared vacuum pumping of load locks 16 and 17 so that one load lock is vacuum pumped while the other load lock is loaded or unloaded. Vacuum pumping of load lock 16 may proceed as follows. A slow roughing cycle may be utilized from 760 torr to 100 torr to limit the risk of particulate contamination. In the slow roughing cycle, fast roughing valve 250 is closed, slow roughing valve 252 is opened, and chamber 16a is pumped at a rate that is established by flow restrictor 254. A fast roughing cycle may be utilized from 100 torr to 3 torr. In the fast roughing cycle, fast roughing valve 250 is opened, and slow roughing valve 252 is closed. Chamber 16a is pumped by roughing pump 224 at a maximum rate permitted by the system configuration. A high vacuum pumping cycle is utilized when a pressure of 3 torr is reached. In the high vacuum pumping cycle, roughing valves 250 and 252 are closed and valves 240 and 244 are opened, thereby permitting turbomolecular vacuum pump 222 to pump chamber 16a. When the system includes water pump 270, turbomolecular pump 222 and water pump 270 operate in parallel during the high vacuum cycle.

It will be understood that the above pressure ranges for the slow and fast roughing cycles and the high vacuum cycle are given by way of example only and are not limiting as to the scope of the invention. In other embodiments, controller 280 may implement a single roughing cycle for each load lock rather than fast and slow roughing cycles.

During pumping of load lock 16, the vacuum valves associated with load lock 17 remain closed. A similar sequence may be utilized for vacuum pumping of load lock 17. Thus, controller 280 establishes a first pumping mode for pumping of load lock 16 and a second pumping mode for pumping of load lock 17. The first and second pumping modes are utilized at different times, such that turbomolecular pump 222, roughing pump 224 and water pump 270 are time shared by load locks 16 and 17. It will be understood that the vacuum pumping system of the invention may be configured for time shared operation with two or more load locks.

The vacuum pumping system 220 shown in FIG. 3 and described above has a number of advantages. Because the turbomolecular pump 222 and the optional water pump 270 are shared by load locks 16 and 17, the cost of the vacuum pumping system is reduced in comparison with prior art systems. Because the vacuum valves are mounted in valve manifold block 226, the assembly is easy to manufacture and is highly reliable. Furthermore, because the valve manifold block 226 is positioned between load locks 16 and 17, the components are relatively close to load locks 16 and 17 and the volume to be pumped is reduced. By reducing the volume of the vacuum pumping system 220, the time to reach a desired pressure is decreased for a given pumping speed.

Having described several embodiments and an example of the invention in detail, various modifications and improvements will readily occur to those skilled in the art. Such modifications and improvements are intended to be within the spirit and the scope of the invention. Furthermore, those skilled in the art would readily appreciate that all parameters listed herein are meant to be exemplary and that actual parameters will depend upon the specific application for which the system of the present invention is used. Accordingly, the foregoing description is by way of example only and is not intended as limiting. The invention is limited only as defined by the following claims and their equivalents.

What is claimed is:

1. A load lock system comprising:
   a first load lock defining a first chamber;
   a second load lock defining a second chamber; and
   a vacuum pumping system configured to vacuum pump the first and second chambers, comprising:
      a valve manifold block positioned between the first and second load locks;
      a first conduit connected to the first load lock;
      a second conduit connected to the second load lock;
      a turbomolecular pump;
      a first valve, mounted in the valve manifold block, to connect the first chamber to an inlet of the turbomolecular pump through the first conduit in a first pumping mode;
      a second valve, mounted in the valve manifold block, to connect the second chamber through the second conduit to the inlet of the turbomolecular pump in a second pumping mode;
      a roughing pump;
      a first fast roughing valve mounted in the valve manifold block to connect the first conduit to an inlet of the roughing pump in a fast roughing cycle of the first pumping mode;
      a first slow roughing valve mounted in the valve manifold block to connect the first conduit to the inlet of the roughing pump in a slow roughing cycle of the first pumping mode;
      a second fast roughing valve mounted in the valve manifold block to connect the second conduit to the inlet of the roughing pump in a fast roughing cycle of the second pumping mode; and
      a second slow roughing valve mounted in the valve manifold block to connect the second conduit to the inlet of the roughing pump in a slow roughing cycle of the second mode.

2. A load lock system as defined in claim 1, wherein the turbomolecular pump is mounted to a port of the valve manifold block.

3. A load lock system as defined in claim 1, wherein the vacuum pumping system further comprises a water pump, wherein the first valve connects the first chamber to an inlet of the water pump in a high vacuum cycle of the first pumping mode and the second valve connects the second chamber to the inlet of the water pump in a high vacuum cycle of the second pumping mode.

4. A load lock system as defined in claim 1, wherein the vacuum pumping system further comprises a foreline valve mounted in the valve manifold block and coupled between a foreline of the turbomolecular pump and the inlet of the roughing pump.

5. A load lock system as defined in claim 1, wherein the vacuum pumping system further comprises an isolation valve coupled in series with the inlet of the turbomolecular pump and mounted in the valve manifold block.

6. A load lock system as defined in claim 1, further comprising a controller to activate the first valve in a high vacuum cycle of the first pumping mode and to activate the second valve in a high vacuum cycle of the second pumping mode.

* * * * *

UNITED STATES PATENT AND TRADEMARK OFFICE
CERTIFICATE OF CORRECTION

PATENT NO. : 7,585,141 B2  Page 1 of 1
APPLICATION NO. : 11/048093
DATED : September 8, 2009
INVENTOR(S) : Evans et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 449 days.

Signed and Sealed this

Fourteenth Day of September, 2010

David J. Kappos
*Director of the United States Patent and Trademark Office*